(12) United States Patent
Aikawa

(10) Patent No.: US 11,493,874 B2
(45) Date of Patent: Nov. 8, 2022

(54) IMAGE FORMING APPARATUS FOR PRINTING USING TONER

(71) Applicant: KYOCERA Document Solutions Inc., Osaka (JP)

(72) Inventor: Yukihiro Aikawa, Osaka (JP)

(73) Assignee: KYOCERA DOCUMENT SOLUTIONS INC., Osaka (JP)

( * ) Notice: Subject to any disclaimer, the term of this patent is extended or adjusted under 35 U.S.C. 154(b) by 0 days.

(21) Appl. No.: 17/335,208

(22) Filed: Jun. 1, 2021

(65) Prior Publication Data

US 2021/0373480 A1 Dec. 2, 2021

(30) Foreign Application Priority Data

Jun. 2, 2020 (JP) .............................. JP2020-096384

(51) Int. Cl.
*G03G 15/00* (2006.01)
*H03K 7/08* (2006.01)

(52) U.S. Cl.
CPC ............... *G03G 15/80* (2013.01); *H03K 7/08* (2013.01)

(58) Field of Classification Search
USPC ...................................................... 399/88, 89
See application file for complete search history.

(56) References Cited

U.S. PATENT DOCUMENTS

2015/0093137 A1* 4/2015 Minami ................. G03G 15/80
399/89

FOREIGN PATENT DOCUMENTS

JP 4170479 B2 * 10/2008
JP 2015-092219 5/2015

* cited by examiner

*Primary Examiner* — Quana Grainger
(74) *Attorney, Agent, or Firm* — Lex IP Meister, PLLC

(57) ABSTRACT

A control circuit of an image forming apparatus outputs a pulse signal. A clock signal generation circuit generates a clock signal, based on the pulse signal. A pulse signal conversion circuit generates a pulse conversion control signal of a voltage value associated with a duty ratio of the pulse signal. An AC voltage generation circuit generates an AC voltage of a frequency based on the clock signal. Either the AC voltage generation circuit or a DC voltage generation circuit generates a voltage whose amplitude or voltage value increases as a voltage value of the received pulse conversion control signal increases, and whose amplitude or voltage value decreases as a voltage value of the pulse conversion control signal decreases.

7 Claims, 6 Drawing Sheets

FIG. 8

| | FIRST AC VOLTAGE GENERATION CIRCUIT | FIRST DC VOLTAGE GENERATION CIRCUIT | SECOND AC VOLTAGE GENERATION CIRCUIT | SECOND DC VOLTAGE GENERATION CIRCUIT |
|---|---|---|---|---|
| 1 | S1 | P1 | S2 | P2 |
| 2 | S1 | P1 | P2 | S2 |
| 3 | S1 | S2 | P1 | P2 |
| 4 | S1 | S2 | P2 | P1 |
| 5 | S1 | P2 | S2 | P1 |
| 6 | S1 | P2 | P1 | S2 |
| 7 | S2 | S1 | P1 | P2 |
| 8 | S2 | S1 | P2 | P1 |
| 9 | S2 | P1 | S1 | P2 |
| 10 | S2 | P1 | P2 | S1 |
| 11 | S2 | P2 | S1 | P1 |
| 12 | S2 | P2 | P1 | S1 |
| 13 | P1 | S1 | S2 | P2 |
| 14 | P1 | S1 | P2 | S2 |
| 15 | P1 | S2 | S1 | P2 |
| 16 | P1 | S2 | P2 | S1 |
| 17 | P1 | P2 | S1 | S2 |
| 18 | P1 | P2 | S2 | S1 |
| 19 | P2 | S1 | S2 | P1 |
| 20 | P2 | S1 | P1 | S2 |
| 21 | P2 | S2 | S1 | P1 |
| 22 | P2 | S2 | P1 | S1 |
| 23 | P2 | P1 | S1 | S2 |
| 24 | P2 | P1 | S2 | S1 |

…

IMAGE FORMING APPARATUS FOR PRINTING USING TONER

INCORPORATION BY REFERENCE

This application is based upon, and claims the benefit of priority from, corresponding Japanese Patent Application No. 2020-096384 filed in the Japan Patent Office on Jun. 2, 2020, the entire contents of which are incorporated herein by reference.

BACKGROUND

Field of the Invention

The present disclosure relates to an image forming apparatus for printing using toner.

Description of Related Art

An image forming apparatus for printing using toner includes a photoconductor drum, and a member for charging the photoconductor drum. When the photoconductor drum is charged by using electric discharge, a high voltage is applied to the charging member. Also, for proper charging, both an AC voltage and a DC voltage may be applied to the charging member.

SUMMARY

An image forming apparatus according to the present disclosure is provided with a control circuit and a high voltage power supply unit. The control circuit outputs a pulse signal. The high voltage power supply unit includes a clock signal generation circuit, a pulse signal conversion circuit, an AC voltage generation circuit for generating an AC voltage, and a DC voltage generation circuit for generating a DC voltage. The high voltage power supply unit applies the AC voltage and the DC voltage to an application target for forming a toner image. The clock signal generation circuit receives the pulse signal. The clock signal generation circuit generates a clock signal, based on the inputted pulse signal. The pulse signal conversion circuit receives the pulse signal. The pulse signal conversion circuit generates a pulse conversion control signal of a voltage value associated with a duty ratio of the input pulse signal. The AC voltage generation circuit receives the clock signal. The AC voltage generation circuit generates the AC voltage of a frequency based on the clock signal. Either the AC voltage generation circuit or the DC voltage generation circuit receives the pulse conversion control signal. Either the AC voltage generation circuit or the DC voltage generation circuit generates a voltage whose amplitude or voltage value increases as a voltage value of the pulse conversion control signal increases, and whose amplitude or voltage value decreases as a voltage value of the pulse conversion control signal decreases.

BRIEF DESCRIPTION OF THE DRAWINGS

FIG. 8 is a diagram illustrating one example of an input destination of each signal according to the second modification.

DETAILED DESCRIPTION

In the following, an embodiment, a first modification, and a second modification according to the present disclosure are described with reference to FIGS. 1 to 8. In the following description, a printer 100 is described as an example of an image forming apparatus. However, each element such as a configuration and a layout described in the present embodiment is not limited to the one in the scope of the disclosure, and is merely an illustrative example. In the following description, an example of using positively charged toner is described. However, the present disclosure is also applicable to an image forming apparatus using negatively charged toner.

(Overview of Printer 100)

Figure 1:
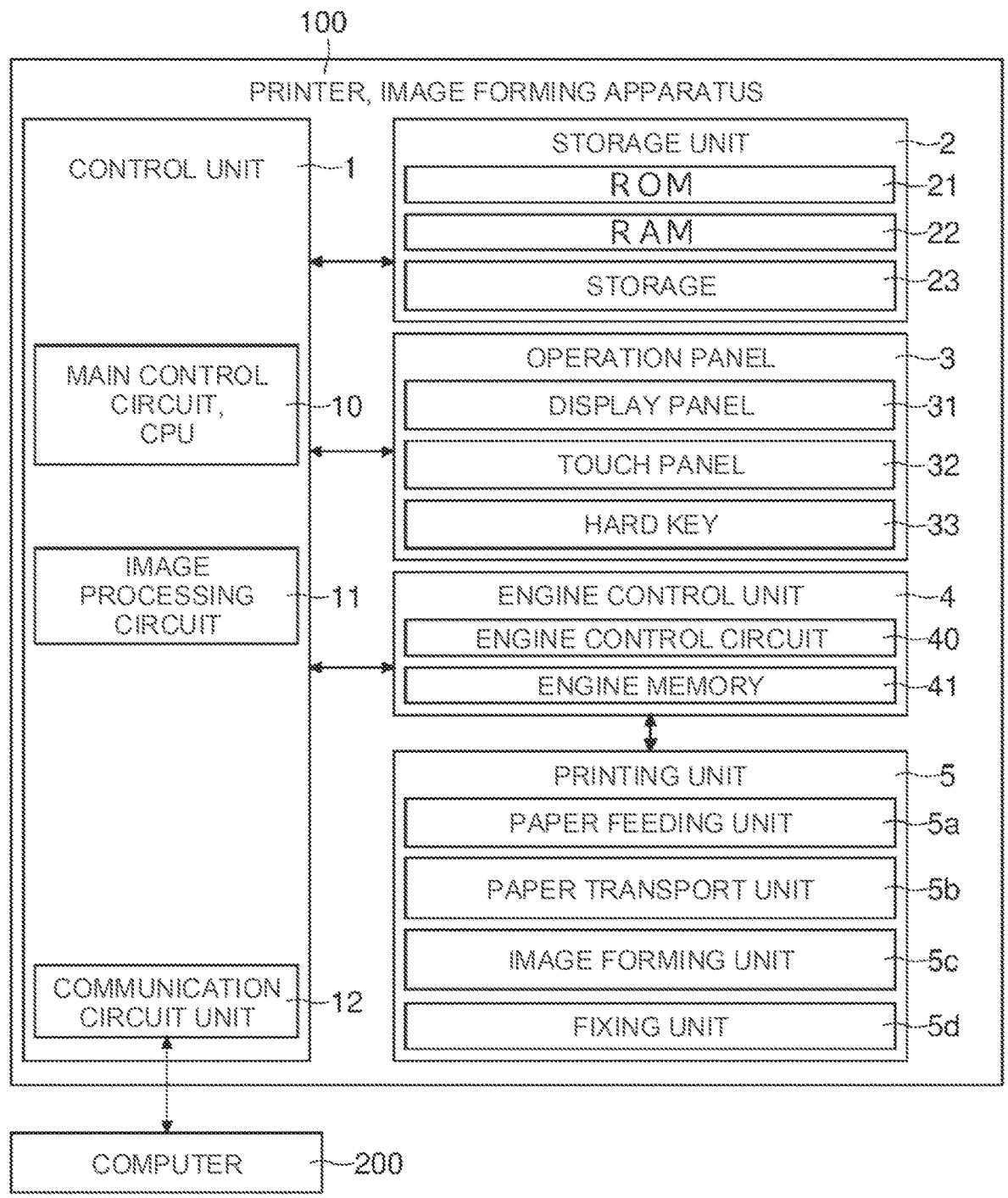
FIG. 1 is a diagram illustrating one example of a printer according to an embodiment.

Next, an overview of the printer 100 according to the embodiment is described based on FIG. 1. FIG. 1 is a diagram illustrating one example of the printer 100 according to the embodiment.

The printer 100 includes a control unit 1, a storage unit 2, an operation panel 3, an engine control unit 4, and a printing unit 5. The control unit 1 is a substrate (main control substrate). The control unit 1 controls an operation of the printer 100. The control unit 1 includes a main control circuit 10, an image processing circuit 11, and a communication circuit unit 12. For example, the main control circuit 10 is a CPU. The main control circuit 10 performs calculations and processing, based on a program and data stored in the storage unit 2, and controls an operation of each unit of the printer 100.

For example, the communication circuit unit 12 includes a connector, a communication control circuit (communication IC), and a communication memory. The communication circuit unit 12 communicates with a computer 200. The communication circuit unit 12 performs communication-associated processing. The communication memory stores communication software. For example, the computer 200 is a PC or a server. The communication circuit unit 12 receives printing data transmitted from the computer 200. The printing data include data in which printing setting data and a printing content are written in a page description language.

For example, the image processing circuit 11 is an integrated circuit designed for image processing, and is, for example, an application specific integrated circuit (ASIC). The image processing circuit 11 generates image data (raster data), based on data written in a page description language included in printing data. The image processing circuit 11 performs image processing of raster data according to a setting content (setting data) for printing on the computer 200. The image processing circuit 11 converts raster data after image processing, and generates image data for output.

The printer 100 includes, as the storage unit 2, a read-only memory (ROM) 21, a random-access memory (RAM) 22, and a storage 23.

For example, the storage 23 is a hard disc drive (HDD) or a solid state drive (SSD). The storage unit 2 includes non-volatile and volatile storage devices.

The printer 100 includes an operation panel 3. The operation panel 3 includes a display panel 31, a touch panel 32, and hard keys 33. The control unit 1 causes the display panel 31 to display a message, a setting screen, and software keys. In addition, the control unit 1 recognizes an operated software key, based on an output of the touch panel 32. The control unit 1 recognizes an operated hard key 33, based on a signal output from the hard key 33.

The printer 100 includes an engine control unit 4 and a printing unit 5. The engine control unit 4 is a substrate (engine control substrate). The engine control unit 4 includes an engine control circuit 40 (equivalent to a control circuit) and an engine memory 41. For example, the engine control circuit 40 includes a processor such as a central processing unit (CPU) or an ASIC. The engine memory 41 includes a RAM and a ROM. For example, the engine control unit 4 controls rotation of a motor included in the printing unit 5. The engine control unit 4 also controls paper transport and toner image formation.

The printing unit 5 includes a paper feeding unit 5a, a paper transport unit 5b, an image forming unit 5c, and a fixing unit 5d. The engine control unit 4 controls operations of the paper feeding unit 5a, the paper transport unit 5b, the image forming unit 5c, and the fixing unit 5d, based on an instruction of the control unit 1.

(Printing Unit 5)

Figure 2:
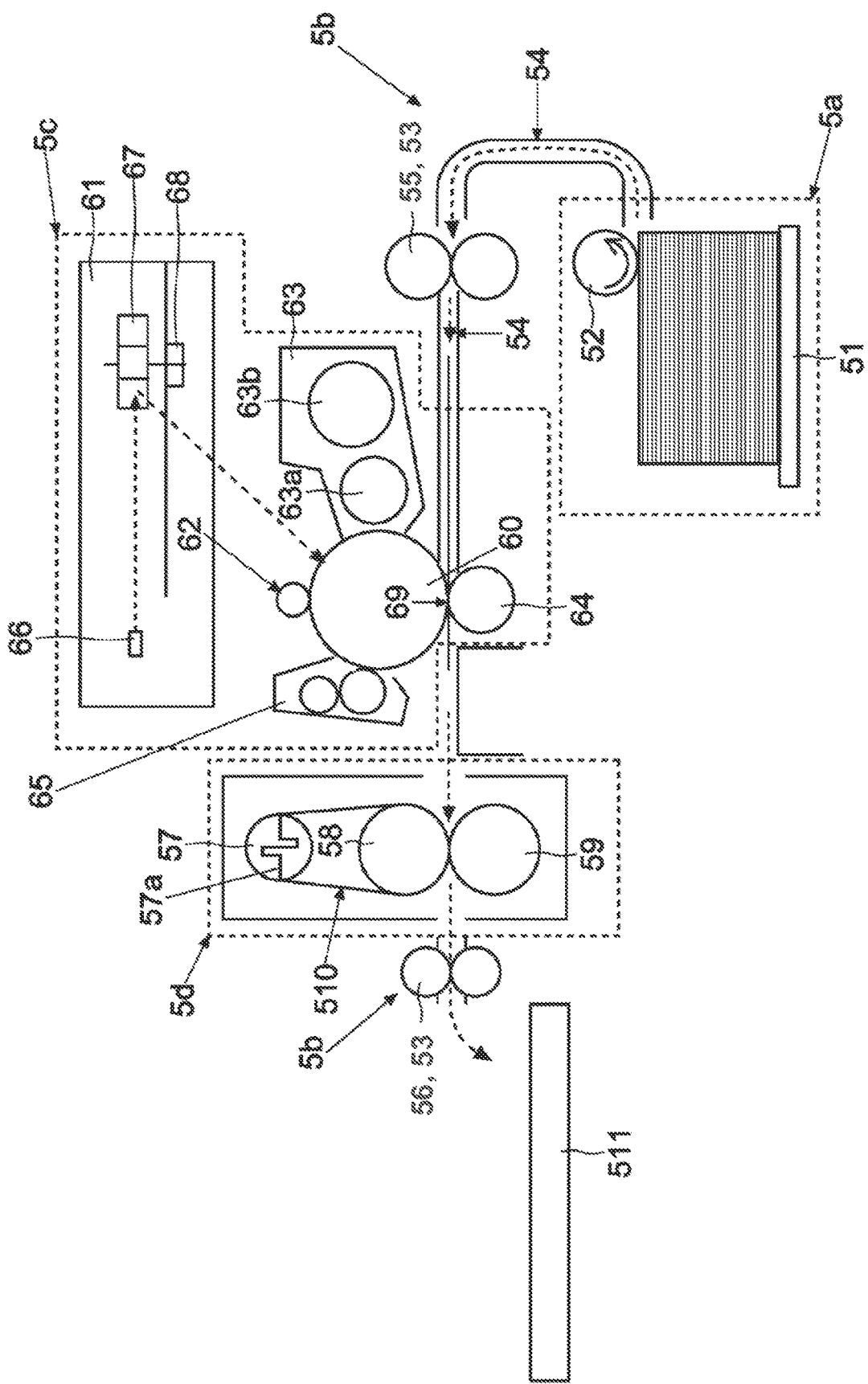
FIG. 2 is a diagram illustrating one example of a printing unit according to the embodiment.

Next, one example of the printing unit 5 according to the embodiment is described with reference to FIG. 2. FIG. 2 is a diagram illustrating one example of the printing unit 5 according to the embodiment.

The paper feeding unit 5a includes, for example, a paper setting plate 51, a paper feeding roller 52, and a paper feeding motor (not illustrated). A bundle of paper is placed on the paper setting plate 51. The paper feeding motor rotates the paper feeding roller 52. During a printing job, the engine control unit 4 rotates the paper feeding roller 52 (paper feeding motor). The rotating paper feeding roller 52 feeds the paper placed on the paper setting plate 51 one by one. The paper is fed to the paper transport unit 5b.

The paper transport unit 5b includes a transport roller pair 53, a transport guide 54, and a transport motor (not illustrated) for transporting paper. The transport motor rotates the transport roller pair 53. This causes the transport roller pair 53 to transport the paper. FIG. 2 illustrates an example in which a registration roller pair 55 and a discharge roller pair 56 are provided as the transport roller pair 53.

The engine control unit 4 stops the registration roller pair 55 when a leading end of the paper reaches the registration roller pair 55. By abutting the leading end of the paper against a nip of the registration roller pair 55, a skew of the paper is corrected. After the correction, the engine control unit 4 rotates the registration roller pair 55 in synchronism with a toner image formed on the image forming unit 5c (photoconductor drum 60). This causes the paper to be fed from the registration roller pair 55 in such a way that the toner image is transferred to an appropriate position of the paper. The transport guide 54 guides the paper to be transported. This causes the paper to be transported along a specific path.

The image forming unit 5c includes the photoconductor drum 60, an exposure device 61, a charging member 62, a developing device 63, a transfer roller 64, and a cleaning device 65. Each device is provided around the photoconductor drum 60 in the order of the charging member 62, the developing device 63, the transfer roller 64, and the cleaning device 65 in a rotating direction of the photoconductor drum 60.

The photoconductor drum 60 is cylindrical. A surface (peripheral surface) of the photoconductor drum 60 is a photosensitive layer. The photosensitive layer is, for example, a layer of amorphous silicon. The image forming unit 5c includes a main motor. The main motor rotates the photoconductor drum 60. During printing, the engine control unit 4 rotates the main motor (not illustrated). During printing, the engine control unit 4 rotates the photoconductor drum 60 at a specific peripheral speed.

The charging member 62 charges the surface of the photoconductor drum 60. The charging member 62 is, for example, a charging roller.

The exposure device 61 includes a semiconductor laser device 66 (laser diode). The exposure device 61 turns the semiconductor laser device 66 on and off, based on image data for output. The exposure device 61 includes a polygon mirror 67 and a polygon motor 68. A shape of the polygon mirror 67 is a polygonal column. The polygon mirror 67 reflects laser light of the semiconductor laser device 66 toward the photoconductor drum 60. The polygon motor 68 rotates the polygon mirror 67. An irradiation position of laser light on the photoconductor drum 60 is moved at a constant speed along a main scanning direction by rotation of the polygon mirror 67. The photoconductor drum 60 is scanned and exposed by irradiation of laser light (optical signal) of the exposure device 61. Positive charge is cancelled on a laser light irradiated portion (pixel) of the photoconductor drum 60. Consequently, an electrostatic latent image associated with image data for output is formed on the peripheral surface of the photoconductor drum 60.

The developing device 63 accommodates toner. The developing device 63 includes a developing roller 63a and a stirring roller 63b. During printing, the developing roller 63a and the stirring roller 63b are rotated. For example, the main motor rotates the developing roller 63a and the stirring roller 63b. During printing, the engine control unit 4 rotates the main motor.

The stirring roller 63b has blades for stirring toner. The toner is stirred by rotation of the stirring roller 63b. Toner is positively charged by friction caused by stirring. Note that the printer 100 includes a replenishing device (not illustrated). When the toner in the developing device 63 decreases, the replenishing device replenishes toner to the developing device 63.

The peripheral surface of the developing roller 63a and the peripheral surface of the photoconductor drum 60 face each other. The rotation axis of the developing roller 63a and the rotation axis of the photoconductor drum 60 are in parallel to each other. A gap is formed between the developing roller 63a and the photoconductor drum 60. The gap is small. For example, the gap is 1 mm or less. The developing roller 63a carries toner on its peripheral surface. The toner is adhered to a portion (pixel) on the peripheral surface of the photoconductor drum 60 where the positive charge is cancelled by exposure. The toner carried by the developing roller 63a develops the electrostatic latent image on the peripheral surface of the photoconductor drum 60. The photoconductor drum 60 is rotated while carrying the toner image developed by the toner supplied from the developing roller 63a.

The peripheral surface of the transfer roller 64 and the peripheral surface of the photoconductor drum 60 face each other. The rotation axis of the transfer roller 64 is in parallel to the rotation axis of the photoconductor drum 60. The transfer roller 64 is in contact with the photoconductor drum 60. A portion where the transfer roller 64 is in contact with the photoconductor drum 60 serves as a transfer nip 69. During printing, the photoconductor drum 60 and the transfer roller 64 are rotated. The paper passes through the transfer nip 69. When the paper passes through the transfer nip 69, the toner image is transferred from the photoconductor drum 60 to the paper. In the example of FIG. 2, the photoconductor drum 60 and the transfer roller 64 are in contact with each other in a vertical direction. The cleaning device 65 collects the toner remaining on the surface of the photoconductor drum 60 after the transfer. The cleaning device 65 cleans the surface of the photoconductor drum 60.

The fixing unit 5d is provided downstream in the paper transport direction of the image forming unit 5c. The fixing unit 5d includes a fixing rotating member. The fixing rotating member includes a first heating roller 57, a second heating roller 58, and a pressure roller 59. A heating belt 510 is spanned between the first heating roller 57 and the second heating roller 58. The first heating roller 57 incorporates a heater 57a. For example, the heater 57a is an IH heater. The second heating roller 58 and the pressure roller 59 sandwich the heating belt 510. The paper on which the toner image is transferred passes between an outer peripheral surface of the heating belt 510 and the pressure roller 59. As a result of heating and pressurization of the paper, the toner is melted, and the toner image is fixed to the paper.

The discharge roller pair 56 is provided downstream in the paper transport direction of the fixing unit 5d. During printing, the engine control unit 4 rotates the discharge roller pair 56. The paper that has passed through the discharge roller pair 56 is discharged onto a discharge tray 511.

(High Voltage Power Supply Unit 7)

Figure 3:
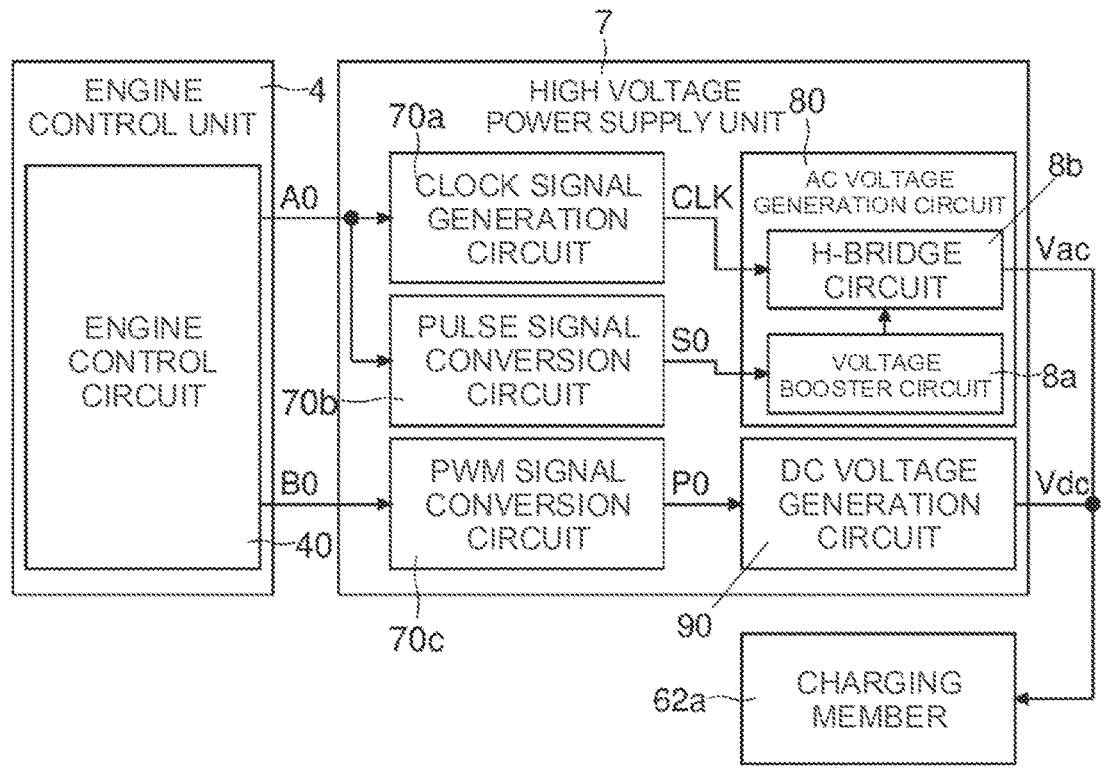
FIG. 3 is a diagram illustrating one example of a high voltage power supply unit according to the embodiment.
Figure 4:
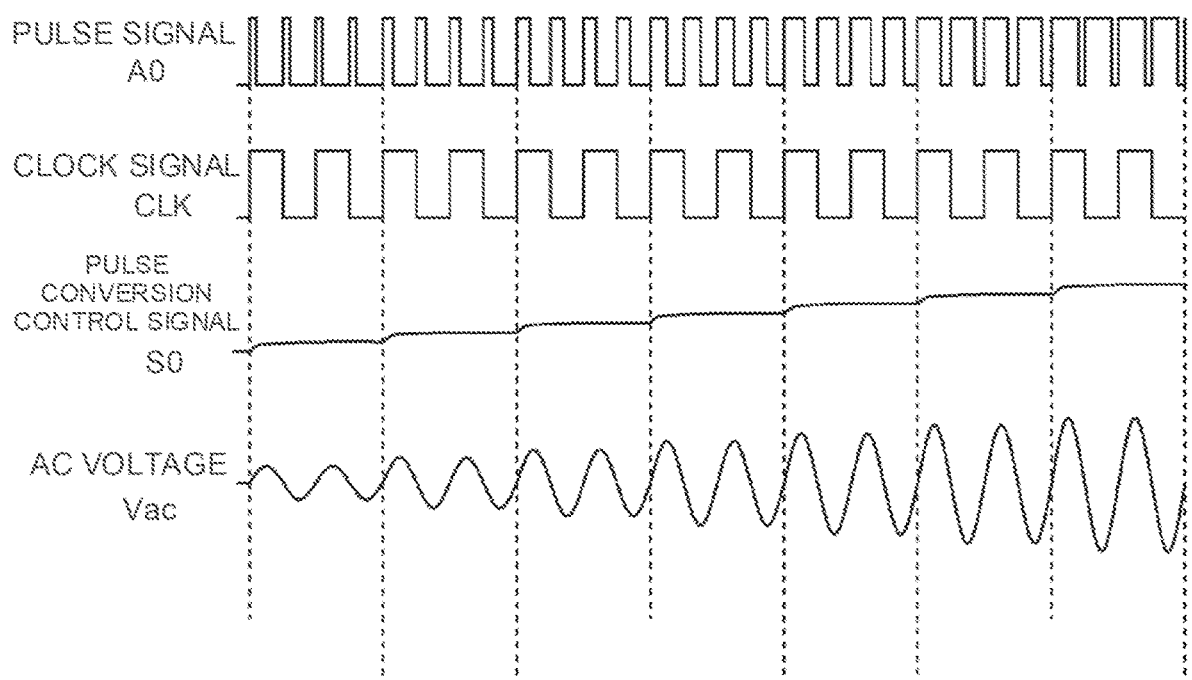
FIG. 4 is a diagram illustrating one example of a signal waveform to be handled by the high voltage power supply unit according to the embodiment.
Figure 5:
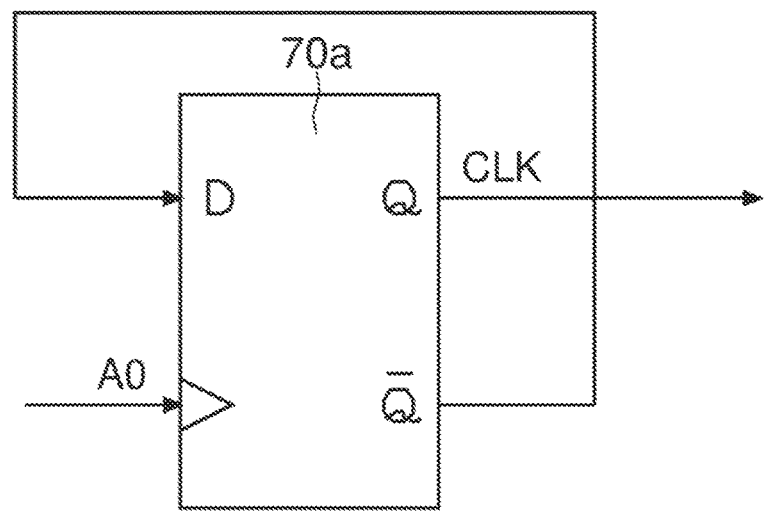
FIG. 5 is a diagram illustrating one example of a clock signal generation circuit according to the embodiment.

Next, one example of a high voltage power supply unit 7 according to the embodiment is described with reference to FIG. 3. FIG. 3 is a diagram illustrating one example of the high voltage power supply unit 7 according to the embodiment. FIG. 4 is a diagram illustrating one example of a signal waveform to be handled by the high voltage power supply unit 7 according to the embodiment. FIG. 5 is a diagram illustrating one example of a clock signal generation circuit 70a according to the embodiment.

The printer 100 includes the high voltage power supply unit 7. The high voltage power supply unit 7 is a power supply substrate (high voltage substrate) for applying a high voltage to a member for forming a toner image. FIG. 3 illustrates one example of the high voltage power supply unit 7 for applying a voltage in which alternate current and direct current are superimposed to the charging member 62. The high voltage power supply unit 7 may apply a voltage to the developing roller 63a, in place of the charging member 62.

The engine control circuit 40 outputs a pulse signal A0 and a PWM signal B0. The pulse signal A0 is a signal for setting a frequency of an AC voltage Vac to be applied to the charging member 62. The pulse signal A0 is also a signal for setting an amplitude (magnitude) of the AC voltage Vac to be applied to the charging member 62. The PWM signal B0 is a signal for setting an amplitude (magnitude) of a DC voltage Vdc to be applied to the charging member 62.

The high voltage power supply unit 7 includes the clock signal generation circuit 70a, a pulse signal conversion circuit 70b, an AC voltage generation circuit 80, a DC voltage generation circuit 90, and a PWM signal conversion circuit 70c.

A pulse signal A0 is input to the clock signal generation circuit 70a. The clock signal generation circuit 70a generates a clock signal CLK, based on the input pulse signal A0.

The pulse signal conversion circuit 70b generates and outputs a pulse conversion control signal S0. The pulse signal conversion circuit 70b outputs a pulse conversion control signal S0 whose voltage value increases as a duty ratio of an input pulse signal A0 increases. The pulse signal conversion circuit 70b outputs a pulse conversion control signal S0 whose voltage value decreases as a duty ratio of an input pulse signal A0 decreases. The pulse signal conversion circuit 70b is, for example, an integral circuit.

The pulse signal conversion circuit 70b may output a pulse conversion control signal S0 whose voltage value decreases as a duty ratio of an input pulse signal A0 increases, and whose voltage value increases as a duty ratio of the pulse signal A0 decreases. The pulse signal conversion circuit 70b may output a pulse conversion control signal S0 of a voltage value associated with a duty ratio of an input pulse signal A0.

The PWM signal conversion circuit 70c generates and outputs a PWM conversion control signal P0. The PWM signal conversion circuit 70c outputs a PWM conversion control signal P0 whose voltage value increases as a duty ratio of an input PWM signal B0 increases. The PWM signal conversion circuit 70c outputs a PWM conversion control signal P0 whose voltage value decreases as a duty ratio of an input PWM signal B0 decreases. The PWM signal conversion circuit 70c is also, for example, an integrated circuit.

The AC voltage generation circuit 80 receives a clock signal CLK and a pulse conversion control signal S0. The AC voltage generation circuit 80 controls a frequency of an AC voltage Vac to be generated based on the clock signal CLK, and controls an amplitude of an AC voltage Vac to be generated based on the pulse conversion control signal S0.

For example, the AC voltage generation circuit 80 has a voltage booster circuit 8a and an H-bridge circuit 8b (single-phase full-bridge circuit). The H-bridge circuit 8b includes a plurality of switching elements. The H-bridge circuit 8b turns ON/OFF of application of a voltage boosted by the voltage booster circuit 8a to the charging member 62. A direction of current can be changed by the H-bridge circuit 8b. For example, the AC voltage generation circuit 80 changes the current direction every half cycle of an input clock signal CLK.

In other words, the AC voltage generation circuit 80 generates an AC voltage Vac of a frequency based on a clock signal CLK. For example, the AC voltage generation circuit 80 generates a sinusoidal AC voltage Vac of the same frequency as the frequency of a clock signal CLK. A frequency (charging frequency) of an AC voltage Vac to be applied to the charging member 62 is determined in advance. The engine control circuit 40 may generate and output a pulse signal A0 of a frequency two times of the charging frequency.

The voltage booster circuit 8a boosts an input pulse conversion control signal S0. The ratio of an input voltage of the voltage booster circuit 8a to an output voltage is determined in advance. In other words, the AC voltage generation circuit 80 generates an AC voltage Vac whose amplitude increases as a voltage value of an input pulse conversion control signal S0 increases, and whose amplitude decreases as a voltage value of the pulse conversion control signal S0 decreases.

For example, the AC voltage generation circuit 80 is an inverter. The AC voltage generation circuit 80 turns ON/OFF of voltage application to the charging member 62 at a high speed during a half cycle of a clock signal CLK. In other words, the AC voltage generation circuit 80 performs chopping. The chopping frequency is sufficiently faster than the frequency of the AC voltage Vac. The AC voltage generation circuit 80 increases or decreases a duty ratio in chopping during a half cycle of a clock signal CLK. Consequently, the AC voltage generation circuit 80 outputs a quasi-sinusoidal AC voltage Vac. The AC voltage generation circuit 80 applies the generated AC voltage Vac to the charging member 62.

For example, a peak-to-peak voltage of the AC voltage Vac to be output from the AC voltage generation circuit 80 is set in the range of several hundred voltages to several kilo voltages. A peak-to-peak voltage of the AC voltage Vac to be applied to the charging member 62 is set in advance. The engine control circuit 40 ensures that the AC voltage Vac is applied at a set voltage. Specifically, the engine control circuit 40 generates and outputs a pulse signal A0 of a duty ratio that results in a set peak-to-peak voltage.

The DC voltage generation circuit 90 receives a PWM conversion control signal P0. The DC voltage generation circuit 90 may perform voltage boosting by using a transformer. Also, the DC voltage generation circuit 90 may be a booster type DCDC converter. In this case, the DC voltage generation circuit 90 includes, for example, a coil, a semiconductor switching element, a diode, and a capacitor. The DC voltage generation circuit 90 boosts the PWM conversion control signal P0. The ratio of an input voltage of the DC voltage generation circuit 90 to an output voltage is determined in advance.

The DC voltage generation circuit 90 generates a DC voltage Vdc whose voltage value increases as a voltage value of an input PWM conversion control signal P0 increases, and whose voltage value decreases as a voltage value of the PWM conversion control signal P0 decreases. The DC voltage generation circuit 90 applies the generated DC voltage Vdc to the charging member 62.

For example, the DC voltage Vdc to be output from the DC voltage generation circuit 90 is set in the range of several hundred voltages to 1 kilo voltage. A magnitude of the DC voltage Vdc to be applied to the charging member 62 is set in advance. The engine control circuit 40 generates and outputs a PWM signal B0 of a duty ratio that causes the DC voltage Vdc to be applied to the charging member 62 to have a set magnitude.

In the timing chart of FIG. 4, an uppermost chart illustrates one example of a pulse signal A0. The chart in the second row illustrates one example of a clock signal CLK to be generated from the clock signal generation circuit 70a. FIG. 5 illustrates one example of the clock signal generation circuit 70a. As illustrated in FIG. 5, a D flip-flop can be used as the clock signal generation circuit 70a. A pulse signal A0 is input to a clock input terminal of the D flip-flop. The flip-flop illustrated in FIG. 5 generates a clock signal CLK whose level is inverted each time a pulse signal A0 rises. Note that the clock signal generation circuit 70a may generate a clock signal CLK whose level is inverted each time a pulse signal A0 falls.

When the clock signal generation circuit 70a in FIG. 5 is used, a frequency of a clock signal CLK becomes one-half of a pulse signal A0. Note that a circuit other than the D flip-flop may be used as the clock signal generation circuit 70a. A frequency of a clock signal CLK does not have to be one-half of a pulse signal A0.

The chart in the third row from the top in FIG. 4 illustrates one example of a pulse conversion control signal S0. FIG. 4 illustrates an example in which a duty ratio of a pulse signal A0 increases stepwise (further to the right). As illustrated in the chart in the third row in FIG. 4, the pulse signal conversion circuit 70b outputs a pulse conversion control signal S0 whose voltage value increases as a duty ratio of a pulse signal A0 increases. Also, the pulse signal conversion circuit 70b outputs a pulse conversion control signal S0 whose voltage value decreases as a duty ratio of a pulse signal A0 decreases.

The lowermost chart in FIG. 4 illustrates one example of an AC voltage Vac to be output from the AC voltage generation circuit 80. In FIG. 4, a pulse conversion control signal S0 increases stepwise (further to the right). For this reason, in the example of FIG. 4, an amplitude (peak-to-peak voltage) of an AC voltage Vac increases stepwise (further to the right). In this way, an amplitude of an AC voltage Vac is associated with (proportional to) a magnitude of a pulse conversion control signal S0.

In this way, it is possible to control three items, namely, a frequency and an amplitude of an AC voltage Vac, and an amplitude of a DC voltage Vdc by two signal lines.

(First Modification)

Figure 6:
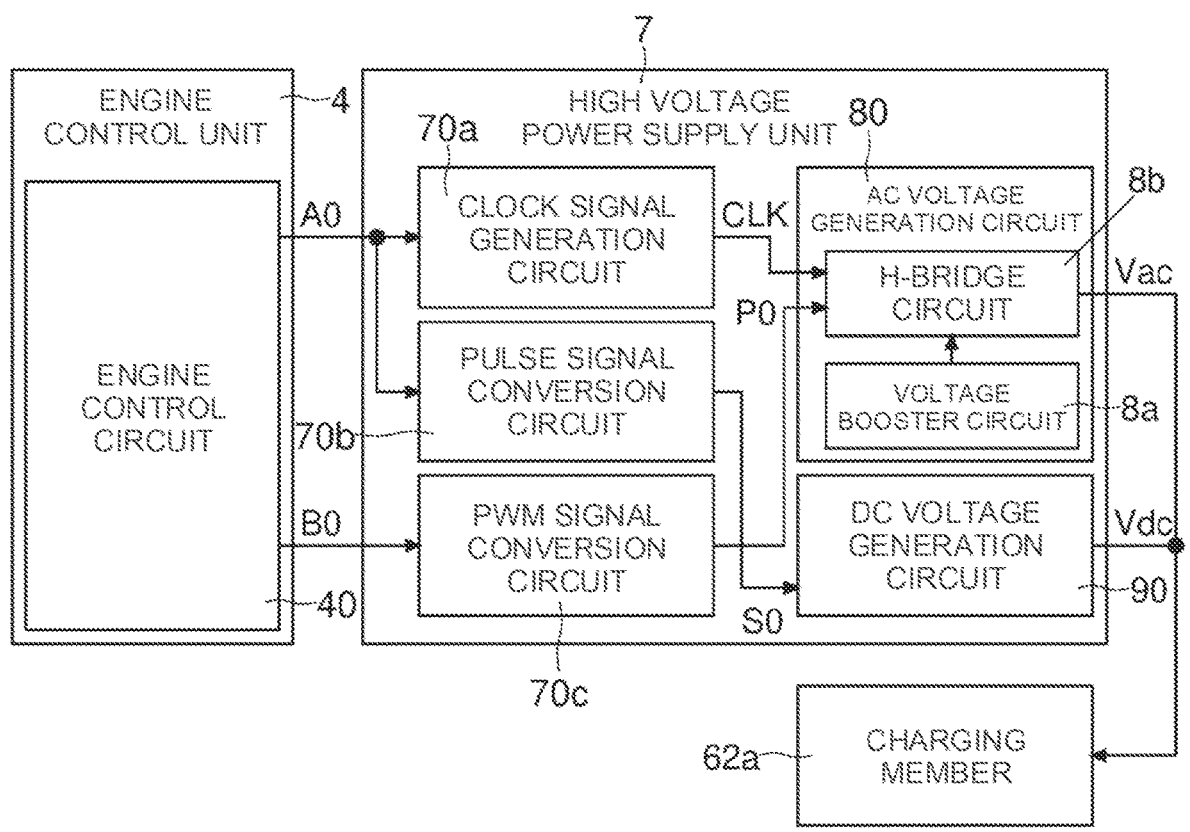
FIG. 6 is a diagram illustrating one example of a high voltage power supply unit according to a first modification.

Next, one example of a printer 100 according to a first modification is described with reference to FIG. 6. FIG. 6 is a diagram illustrating one example of a high voltage power supply unit 7 according to the first modification.

In the above-described embodiment, an example is described in which a pulse conversion control signal S0 is input to the AC voltage generation circuit 80, and an AC voltage Vac is generated based on the pulse conversion control signal S0. Also, in the above-described embodiment, an example is described in which a PWM conversion control signal P0 is input to the DC voltage generation circuit 90, and a DC voltage Vdc is generated based on the PWM conversion control signal P0.

As illustrated in FIG. 6, a pulse signal conversion circuit 70b may input a pulse conversion control signal S0 to a DC voltage generation circuit 90, in place of an AC voltage generation circuit 80. Also, a PWM signal conversion circuit 70c may input a PWM conversion control signal P0 to the AC voltage generation circuit 80, in place of the DC voltage generation circuit 90. The printer 100 according to the first modification may be the same as in the embodiment in a portion other than the high voltage power supply unit 7.

Note that a clock signal generation circuit 70a, the pulse signal conversion circuit 70b, the PWM signal conversion circuit 70c, the AC voltage generation circuit 80, and the DC voltage generation circuit 90 according to the first modification are similar to those described in the embodiment.

Also in the first modification, a pulse signal A0 is input to the clock signal generation circuit 70a. The clock signal generation circuit 70a generates a clock signal CLK, based on the input pulse signal A0. The pulse signal conversion circuit 70b outputs a pulse conversion control signal S0 whose voltage value increases as a duty ratio of an input pulse signal A0 increases. The pulse signal conversion circuit 70b outputs a pulse conversion control signal S0 whose voltage value decreases as a duty ratio of an input pulse signal A0 decreases. Note that the pulse signal conversion circuit 70b may output a pulse conversion control signal S0 whose voltage value decreases as a duty ratio of an input pulse signal A0 increases, and whose voltage value increases as a duty ratio of the pulse signal A0 decreases. The PWM signal conversion circuit 70c outputs a PWM conversion control signal P0 whose voltage value increases as a duty ratio of an input PWM signal B0 increases. The PWM signal conversion circuit 70c outputs a PWM conversion control signal P0 whose voltage value decreases as a duty ratio of an input PWM signal B0 decreases.

In the first modification, a clock signal CLK and a PWM conversion control signal P0 are input to the AC voltage generation circuit 80. The AC voltage generation circuit 80 controls a frequency of an AC voltage Vac to be generated based on the clock signal CLK. The AC voltage generation circuit 80 also controls an amplitude of an AC voltage Vac to be generated based on the PWM conversion control signal P0.

The first modification is similar to the embodiment in a point that the AC voltage generation circuit 80 generates an AC voltage Vac of a frequency based on a clock signal CLK. The first modification is also similar to the embodiment in a point that a voltage booster circuit 8a of the AC voltage generation circuit 80 boosts an input signal. In the modification, the AC voltage generation circuit 80 boosts a PWM conversion control signal P0. The AC voltage generation circuit 80 generates an AC voltage Vac whose amplitude increases as a voltage value of an input PWM conversion control signal P0 increases, and whose amplitude decreases as a voltage value of the PWM conversion control signal P0 decreases. The AC voltage generation circuit 80 applies the generated AC voltage Vac to a charging member 62. An engine control circuit 40 generates and outputs a PWM signal B0 of a duty ratio that results in a set peak-to-peak voltage.

In the first modification, a pulse conversion control signal S0 is input to the DC voltage generation circuit 90. The DC voltage generation circuit 90 boosts the pulse conversion control signal S0. Therefore, the DC voltage generation circuit 90 generates a DC voltage Vdc whose voltage value increases as a voltage value of an input pulse conversion control signal S0 increases, and whose voltage value decreases as a voltage value of the pulse conversion control signal S0 decreases. The engine control circuit 40 generates a pulse signal A0 of a duty ratio that causes the DC voltage Vdc to be applied to the charging member 62 to have a preset magnitude. The DC voltage generation circuit 90 applies the generated DC voltage Vdc to the charging member 62.

The image forming apparatus (printer 100) according to the embodiment and the first modification is provided with a control circuit (engine control circuit 40) and the high voltage power supply unit 7. The control circuit outputs a pulse signal A0. The high voltage power supply unit 7 includes the clock signal generation circuit 70a, the pulse signal conversion circuit 70b, the AC voltage generation circuit 80 for generating an AC voltage Vac, and the DC voltage generation circuit 90 for generating a DC voltage Vdc. The high voltage power supply unit 7 applies the AC voltage Vac and the DC voltage Vdc to an application target for forming a toner image. The clock signal generation circuit 70a receives the pulse signal A0. The clock signal generation circuit 70a generates a clock signal CLK, based on the input pulse signal A0. The pulse signal conversion circuit 70b receives the pulse signal A0. The pulse signal conversion circuit 70b generates a pulse conversion control signal S0 of a voltage value associated with a duty ratio of the input pulse signal A0. The AC voltage generation circuit 80 receives the clock signal CLK. The AC voltage generation circuit 80 generates an AC voltage Vac of a frequency based on the clock signal CLK. Either the AC voltage generation circuit 80 or the DC voltage generation circuit 90 receives the pulse conversion control signal S0. Either the AC voltage generation circuit 80 or the DC voltage generation circuit 90 generates a voltage whose amplitude or voltage value increases as a voltage value of the pulse conversion control signal S0 increases, and whose amplitude or voltage value decreases as a voltage value of the pulse conversion control signal S0 decreases.

Conventionally, one control signal line is provided for each item of an amplitude of the AC voltage Vac, a frequency of the AC voltage Vac, and a voltage value of the DC voltage Vdc. In the image forming apparatus according to the present application, it is possible to control a frequency of the AC voltage Vac, and a magnitude of an amplitude of the AC voltage Vac or the DC voltage Vdc by one pulse signal A0. It is possible to control a plurality of items by one signal line. The number of signal lines can be reduced.

Since the number of signal lines is reduced, design and assembly (wiring work) of the image forming apparatus can be simplified. Also, the manufacturing cost of the image forming apparatus can be reduced. In addition, the number of terminals (ports) required for the control circuit is reduced. The cost of the image forming apparatus can be further reduced by adopting a compact control circuit as compared with the conventional art.

The control circuit outputs a PWM signal B0. The high voltage power supply unit 7 includes the PWM signal conversion circuit 70c for receiving the PWM signal. The PWM signal conversion circuit 70c generates a PWM conversion control signal P0 whose voltage value increases as a duty ratio of an input PWM signal B0 increases, and whose voltage value decreases as a duty ratio of the PWM signal B0 decreases. The pulse conversion control signal S0 is input to one of the AC voltage generation circuit 80 and the DC voltage generation circuit 90. The other of the AC voltage generation circuit 80 and the DC voltage generation circuit 90 receives the PWM conversion control signal P0. The other of the AC voltage generation circuit 80 and the DC voltage generation circuit 90 generates a voltage whose amplitude or voltage value increases as a voltage value of the PWM conversion control signal P0 increases, and whose amplitude or voltage value decreases as a voltage value of the PWM conversion control signal P0 decreases. It is possible to control a magnitude of the AC voltage Vac or the DC voltage Vdc to be applied to an application target by using the PWM signal B0.

The clock signal generation circuit 70a is a D flip-flop. The clock signal generation circuit 70a inverts a level of a clock signal CLK in accordance with rise or fall of a pulse signal A0. It is possible to generate a clock signal CLK by using the D flip-flop. Even when a duty ratio of the pulse signal A0 increases or decreases, a stable clock signal CLK can be generated.

The pulse signal conversion circuit 70b includes an integrated circuit. It is possible to generate a pulse conversion control signal S0 whose voltage value increases as a duty ratio of the pulse signal A0 increases. It is possible to generate a pulse conversion control signal S0 whose voltage value decreases as a duty ratio of the pulse signal A0 decreases.

The application target is the charging member 62 for charging the photoconductor drum 60, or the developing roller 63a for developing the photoconductor drum 60, while holding toner. A voltage in which alternate current and direct current are superimposed can be applied to a member for forming a toner image.

(Second Modification)

Figure 7:
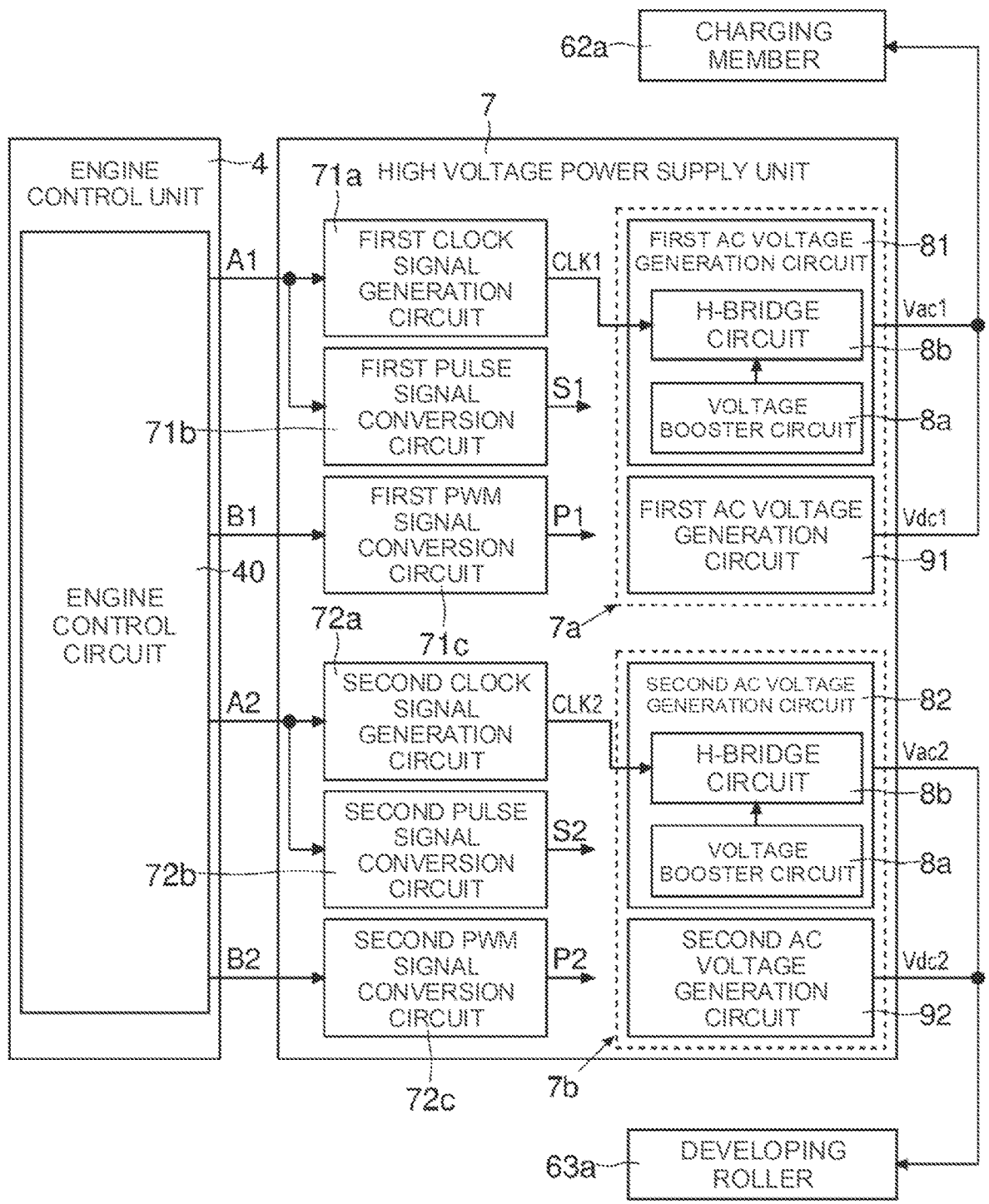
FIG. 7 is a diagram illustrating one example of a high voltage power supply unit according to a second modification.

Next, one example of a printer 100 according to a second modification is described with reference to FIGS. 7 and 8. FIG. 7 is a diagram illustrating one example of a high voltage power supply unit 7 according to the second modification. FIG. 8 is a diagram illustrating one example of an input destination of each signal according to the second modification.

The printer 100 according to the second modification is different from the printer 100 according to the embodiment and the first modification in the high voltage power supply unit 7. Other portions may be the same. The high voltage power supply unit 7 according to the second modification includes two combinations of an AC voltage generation circuit and a DC voltage generation circuit. In the following, a combination of an AC voltage generation circuit and a DC voltage generation circuit is referred to as a circuit block. One of the circuit blocks applies a voltage in which alternate current and direct current are superimposed to a charging member 62 (equivalent to a first application target). The other of the circuit blocks applies a voltage in which alternate current and direct current are superimposed to a developing roller 63a (equivalent to a second application target).

In the following description, for convenience of explanation, a circuit block for applying a voltage to the charging member 62 is referred to as a first circuit block 7a. An AC voltage generation circuit included in the first circuit block 7a is referred to as a first AC voltage generation circuit 81. A DC voltage generation circuit included in the first circuit block 7a is referred to as a first DC voltage generation circuit 91.

Further, a circuit block for applying a voltage to the developing roller 63a is referred to as a second circuit block 7b. An AC voltage generation circuit included in the second circuit block 7b is referred to as a second AC voltage generation circuit 82. A DC voltage generation circuit included in the second circuit block 7b is referred to as a second DC voltage generation circuit 92.

The first AC voltage generation circuit 81 and the second AC voltage generation circuit 82 are similar to the AC voltage generation circuit 80 described in the embodiment and the first modification. These circuits generate an AC voltage of a frequency based on an input clock signal. In addition, the first AC voltage generation circuit 81 generates a first AC voltage Vac1 of an amplitude associated with a voltage value of an input control signal. The second AC voltage generation circuit 82 generates a second AC voltage Vac2 of an amplitude associated with a voltage value of an input control signal.

The first DC voltage generation circuit 91 and the second DC voltage generation circuit 92 are similar to the DC voltage generation circuit 90 described in the embodiment and the first modification. These circuits generate a DC voltage of a voltage value associated with a voltage value of an input control signal.

The high voltage power supply unit 7 according to the second modification includes a first clock signal generation circuit 71a and a second clock signal generation circuit 72a. The first clock signal generation circuit 71a and the second clock signal generation circuit 72a are similar to the clock signal generation circuit 70a described in the embodiment and the first modification. For example, a D flip-flop can be used as each clock signal generation circuit. The first clock signal generation circuit 71a and the second clock signal generation circuit 72a generate a clock signal, based on an input pulse signal.

In the present description, an example is described in which a frequency of an AC voltage to be applied to the charging member 62, and a frequency of an AC voltage to be applied to the developing roller 63a are different from each other. In the second modification, an engine control circuit 40 generates and outputs two types of pulse signals (a first pulse signal A1 and a second pulse signal A2). The engine control circuit 40 inputs different pulse signals to the first clock signal generation circuit 71a and the second clock signal generation circuit 72a.

In the following description, a pulse signal to be input to the first clock signal generation circuit 71a is referred to as a first pulse signal A1. The first pulse signal A1 is used to generate a first AC voltage Vac1 to be applied to the charging member 62. Further, a pulse signal to be input to the second clock signal generation circuit 72a is referred to as a second pulse signal A2. The second pulse signal A2 is used to generate a second AC voltage Vac2 to be applied to the developing roller 63a.

The first clock signal generation circuit 71a generates a first clock signal CLK1. The first clock signal CLK1 is input to the first AC voltage generation circuit 81. The second clock signal generation circuit 72a generates a second clock signal CLK2. The second clock signal CLK2 is input to the second AC voltage generation circuit 82.

The high voltage power supply unit 7 according to the second modification is provided with two pulse signal conversion circuits. In the following description, one of the two pulse signal conversion circuits, to which the first pulse signal A1 is input, is referred to as a first pulse signal conversion circuit 71b. The other of the two pulse signal conversion circuits, to which the second pulse signal A2 is input, is referred to as a second pulse signal conversion circuit 72b. The first pulse signal conversion circuit 71b and the second pulse signal conversion circuit 72b are similar to the pulse signal conversion circuit 70b described in the embodiment and the first modification. The first pulse signal conversion circuit 71b and the second pulse signal conversion circuit 72b are, for example, integrated circuits.

The first pulse signal conversion circuit 71b converts an input first pulse signal A1, and generates a first pulse conversion control signal S1. The first pulse signal conversion circuit 71b generates and outputs a first pulse conversion control signal S1 whose voltage value increases as a duty ratio of the first pulse signal A1 increases. Also, the first pulse signal conversion circuit 71b generates and outputs a first pulse conversion signal S1 whose voltage value decreases as a duty ratio of the first pulse signal A1 decreases.

The first pulse signal conversion circuit 71b may output a first pulse conversion control signal S1 whose voltage value decreases as a duty ratio of an input first pulse signal A1 increases, and whose voltage value increases as a duty ratio of the first pulse signal A1 decreases. The first pulse signal conversion circuit 71b may output a first pulse conversion control signal S1 of a voltage value associated with a duty ratio of an input first pulse signal A1.

The second pulse signal conversion circuit 72b converts an input second pulse signal A2, and generates a second pulse conversion control signal S2. The second pulse signal conversion circuit 72b generates and outputs a second pulse conversion control signal S2 whose voltage value increases as a duty ratio of the second pulse signal A2 increases. Also, the second pulse signal conversion circuit 72b generates and outputs a second pulse conversion control signal S2 whose voltage value decreases as a duty ratio of the second pulse signal A2 decreases.

Note that the second pulse signal conversion circuit 72b may output a second pulse conversion control signal S2 whose voltage value decreases as a duty ratio of an input second pulse signal A2 increases, and whose voltage value increases as a duty ratio of the second pulse signal A2 decreases. The second pulse signal conversion circuit 72b may output a second pulse conversion control signal S2 of a voltage value associated with a duty ratio of an input second pulse signal A2.

Further, the high voltage power supply unit 7 according to the second modification is provided with two PWM signal conversion circuits. In the second modification, the engine control circuit 40 generates and outputs two types of PWM signals. Specifically, the engine control circuit 40 generates and outputs a first PWM signal B1 and a second PWM signal B2. In the following description, one of the two PWM signal conversion circuits, to which the first PWM signal B1 is input, is referred to as a first PWM signal conversion circuit 71c. The other of the two PWM signal conversion circuits, to which the second PWM signal B2 is input, is referred to as a second PWM signal conversion circuit 72c. The first PWM signal conversion circuit 71c and the second PWM signal conversion circuit 72c are similar to the PWM signal conversion circuit 70c described in the embodiment and the first modification. The first PWM signal conversion circuit 71c and the second PWM signal conversion circuit 72c are, for example, integrated circuits.

The first PWM signal conversion circuit 71c converts an input first PWM signal B1, and generates a first PWM conversion control signal P1. The first PWM signal conversion circuit 71c generates and outputs a first PWM conversion control signal P1 whose voltage value increases as a duty ratio of the first PWM signal B1 increases. Also, the first PWM signal conversion circuit 71c generates and outputs a first PWM conversion control signal P1 whose voltage value decreases as a duty ratio of the first PWM signal B1 decreases.

The second PWM signal conversion circuit 72c converts an input second PWM signal B2, and generates a second PWM conversion control signal P2. The second PWM signal conversion circuit 72c generates and outputs a second PWM conversion control signal P2 whose voltage value increases as a duty ratio of the second PWM signal B2 increases. Also, the second PWM signal conversion circuit 72c generates and outputs a second PWM conversion control signal P2 whose voltage value decrease as a duty ratio of the second PWM signal B2 decreases.

Herein, amplitudes of output voltages of the first AC voltage generation circuit 81 and the second AC voltage generation circuit 82, and voltage values of output voltages of the first DC voltage generation circuit 91 and the second DC voltage generation circuit 92 are all determined based on voltage values of input control signals.

For this reason, a first pulse conversion control signal S1 may be input to the first AC voltage generation circuit 81. Also, a first pulse conversion control signal S1 may be input to the second AC voltage generation circuit 82. Also, a first pulse conversion control signal S1 may be input to the first DC voltage generation circuit 91. A first pulse conversion control signal S1 may be input to the second DC voltage generation circuit 92. The engine control circuit 40 only has to generate a first pulse signal A1 at a duty ratio that results in an amplitude or a voltage value that is desired to be output, no matter to which generation circuit a first pulse conversion control signal S1 is input.

Likewise, a second pulse conversion control signal S2 may be input to the first AC voltage generation circuit 81. Also, a second pulse conversion control signal S2 may be input to the second AC voltage generation circuit 82. Also, a second pulse conversion control signal S2 may be input to the first DC voltage generation circuit 91. A second pulse conversion control signal S2 may be input to the second DC voltage generation circuit 92. The engine control circuit 40 only has to generate a second pulse signal A2 at a duty ratio that results in an amplitude or a voltage value that is desired to be output, no matter to which generation circuit a second pulse conversion control signal S2 is input.

Likewise, a first PWM conversion control signal P1 may be input to the first AC voltage generation circuit 81. Also, a first PWM conversion control signal P1 may be input to the second AC voltage generation circuit 82. Also, a first PWM conversion control signal P1 may be input to the first DC voltage generation circuit 91. A first PWM conversion control signal P1 may be input to the second DC voltage generation circuit 92. The engine control circuit 40 only has to generate a first PWM signal B1 at a duty ratio that results in an amplitude or a voltage value that is desired to be output, no matter to which generation circuit a first PWM conversion control signal P1 is input.

Likewise, a second PWM conversion control signal P2 may be input to the first AC voltage generation circuit 81. Also, a second PWM conversion control signal P2 may be input to the second AC voltage generation circuit 82. Also, a second PWM conversion control signal P2 may be input to the first DC voltage generation circuit 91. A second PWM conversion control signal P2 may be input to the second DC voltage generation circuit 92. The engine control circuit 40 only has to generate a second PWM signal B2 at a duty ratio that results in an amplitude or a voltage value that is desired to be output, no matter to which generation circuit a second PWM conversion control signal P2 is input.

In this way, a first pulse conversion control signal S1, a second pulse conversion control signal S2, a first PWM conversion control signal P1, and a second PWM conversion control signal P2 are input to any one of the first AC voltage generation circuit 81, the second AC voltage generation circuit 82, the first DC voltage generation circuit 91, and the second DC voltage generation circuit 92. Only one of the four types of control signals is input to each voltage generation circuit.

FIG. 8 illustrates one example of combination of control signals to be input to the first AC voltage generation circuit 81, the second AC voltage generation circuit 82, the first DC voltage generation circuit 91, and the second DC voltage generation circuit 92. S1 in FIG. 8 indicates a first pulse conversion control signal S1. S2 indicates a second pulse conversion control signal S2. P1 indicates a first PWM conversion control signal P1. P2 indicates a second PWM conversion control signal P2.

There are four input destinations (voltage generation circuits) with respect to four types of signals (conversion control signals). Therefore, there are 24 types of combinations. For example, it is sufficient to determine which one of the conversion control signals is input to which one of the voltage generation circuits, taking a wiring condition and noise into consideration.

In this way, the image forming apparatus (printer 100) according to the second modification is provided with a control circuit (engine control circuit 40) and the high voltage power supply unit 7. The control circuit outputs a first pulse signal A1 and a second pulse signal A2. The high voltage power supply unit 7 includes the first clock signal generation circuit 71a, the second clock signal generation circuit 72a, the first pulse signal conversion circuit 71b, the second pulse signal conversion circuit 72b, the first AC voltage generation circuit 81 for generating a first AC voltage Vac1 to be applied to a first application target (charging member 62), the second AC voltage generation circuit 82 for generating a second AC voltage Vac2 to be applied to a second application target (developing roller 63a), the first DC voltage generation circuit 91 for generating a first DC voltage Vdc1 to be applied to the first application target, and the second DC voltage generation circuit 92 for generating a second DC voltage Vdc2 to be applied to the second application target. The high voltage power supply unit 7 outputs a voltage for forming a toner image. The first clock signal generation circuit 71a receives the first pulse signal A1. The first clock signal generation circuit 71a generates a first clock signal CLK1, based on the input first pulse signal A1. The first pulse signal conversion circuit 71b receives the first pulse signal A1. The first pulse signal conversion circuit 71b generates a first pulse conversion control signal S1 of a voltage value associated with a duty ratio of the input first pulse signal A1. The second clock signal generation circuit 72a receives the second pulse signal A2. The second clock signal generation circuit 72a generates a second clock signal CLK2, based on the input second pulse signal A2. The second pulse signal conversion circuit 72b receives the second pulse signal A2. The second pulse signal conversion circuit 72b generates a second pulse conversion control signal S2 of a voltage value associated with a duty ratio of the input second pulse signal A2. The first AC voltage generation circuit 81 receives the first clock signal CLK1. The first AC voltage generation circuit 81 generates the first AC voltage Vac1 of a frequency based on the first clock signal CLK1. The second AC voltage generation circuit 82 receives the second clock signal CLK2. The second AC voltage generation circuit 82 generates the second AC voltage Vac2 of a frequency based on the second clock signal CLK2. One of the first AC voltage generation circuit 81, the second AC voltage generation circuit 82, the first DC voltage generation circuit 91, and the second DC voltage generation circuit 92 receives the first pulse conversion control signal S1, generates a voltage whose amplitude or voltage value increases as a voltage value of the first pulse conversion control signal S1 increases, and generates a voltage whose amplitude or voltage value decreases as a voltage value of the first pulse conversion control signal S1 decreases. One of the first AC voltage generation circuit 81, the second AC voltage generation circuit 82, the first DC voltage generation circuit 91, and the second DC voltage generation circuit 92, to which the first pulse conversion control signal S1 is not input, receives the second pulse conversion control signal S2, generates a voltage whose amplitude or voltage value increases as a voltage value of the second pulse conversion control signal S2 increases, and generates a voltage whose amplitude or voltage value decreases as a voltage value of the second pulse conversion control signal S2 decreases.

Frequencies of two AC voltages Vac can be controlled respectively by using the first pulse signal A1 and the second pulse signal A2. Also, amplitudes or voltage values of voltages to be output from two of the first AC voltage generation circuit 81, the second AC voltage generation circuit 82, the first DC voltage generation circuit 91, and the second DC voltage generation circuit 92 can be controlled by using the first pulse signal A1 and the second pulse signal A2. Four items can be controlled by two signal lines. The number of signal lines can be reduced.

Since the number of signal lines is reduced, design and assembly of the image forming apparatus can be simplified. Also, the manufacturing cost of the image forming apparatus can be reduced. In addition, the number of terminals (ports) required for the control circuit is reduced. The cost of the image forming apparatus can be further reduced by adopting a compact control circuit as compared with the conventional art.

In addition, the control circuit (engine control circuit 40) outputs a first PWM signal B1 and a second PWM signal B2. The high voltage power supply unit 7 includes the first PWM signal conversion circuit 71c to which the first PWM signal B1 is input, and the second PWM signal conversion circuit 72c to which the second PWM signal B2 is input. The first PWM signal conversion circuit 71c generates a first PWM conversion control signal P1 whose voltage value increases as a duty ratio of an input first PWM signal B1 increases, and whose voltage value decreases as a duty ratio of the first PWM signal B1 decreases. The second PWM signal conversion circuit 72c generates a second PWM conversion control signal P2 whose voltage value increases as a duty ratio of an input second PWM signal B2 increases, and whose voltage value decreases as a duty ratio of the second PWM signal B2 decreases. One of the first AC voltage generation circuit 81, the second AC voltage generation circuit 82, the first DC voltage generation circuit 91, and the second DC voltage generation circuit 92, to which a first pulse conversion control signal S1 and a second pulse conversion control signal S2 are not input, receives a first PWM conversion control signal P1, and generates a voltage whose amplitude or voltage value increases as a voltage value of the first PWM conversion control signal P1 increases, and whose amplitude or voltage value decreases as a voltage value of the first PWM conversion control signal P1 decreases. One of the first AC voltage generation circuit 81, the second AC voltage generation circuit 82, the first DC voltage generation circuit 91, and the second DC voltage generation circuit 92, to which a first pulse conversion control signal S1, a second pulse conversion control signal S2, and a first PWM conversion control signal P1 are not input, receives a second PWM conversion control signal P2, and generates a voltage whose amplitude or voltage value of the second PWM conversion control signal P2 increases, and whose amplitude or voltage value decreases as a voltage value of the second PWM conversion control signal P2 decreases. Amplitude of voltages to be output from two of the first AC voltage generation circuit 81, the second AC voltage generation circuit 82, the first DC voltage generation circuit 91, and the second DC voltage generation circuit 92 can be controlled by using the first PWM signal B1 and the second PWM signal B2. An AC voltage Vac or a DC voltage Vdc to be applied to an application target can be controlled.

Although an embodiment according to the present disclosure has been described, the scope of the present disclosure is not limited to the above. The present disclosure can be implemented by adding various changes within the scope of the disclosure.

The present disclosure is applicable to an imaging apparatus in which a voltage is applied to a member for use in toner printing.

What is claimed is:

1. An image forming apparatus comprising:
a high voltage power supply unit including a clock signal generation circuit, a pulse signal conversion circuit, an AC voltage generation circuit for generating an AC voltage, a PWM signal conversion circuit, and a DC voltage generation circuit for generating a DC voltage, and the high voltage power supply unit applying the AC voltage and the DC voltage to an application target for forming a toner image; and
a control circuit for outputting a signal to control the high voltage power supply unit, wherein the control circuit outputs, to the high voltage power supply unit, a pulse signal to be used to control setting of a frequency of an AC voltage and setting of an amplitude or voltage value of one of the AC voltage and the DC voltage, and a PWM signal to be used to control setting of the amplitude or the voltage value of the other of the AC voltage and the DC voltage, the pulse signal being input to the clock signal generation circuit and the pulse signal conversion circuit, and the PWM signal being input to the PWM signal conversion circuit, the clock signal generation circuit receives the pulse signal, and generates a clock signal, based on the received pulse signal, the pulse signal conversion circuit receives the pulse signal, and generates a pulse conversion control signal of a voltage value associated with a duty ratio of the received pulse signal, the AC voltage generation circuit receives the clock signal, and generates the AC voltage of a frequency based on the clock signal, one of the AC voltage generation circuit and the DC voltage generation circuit receives the pulse conversion control signal and generates a voltage whose amplitude or voltage value increases as a voltage value of the pulse conversion control signal increases, and whose amplitude or voltage value decreases as a voltage value of the pulse conversion control signal decreases, the PWM signal conversion circuit receives the PWM signal and generates a PWM conversion control signal whose voltage value increases as a duty ratio of the received PWM signal increases, and whose voltage value decreases as a duty ratio of the PWM signal decreases, and the other of the AC voltage generation circuit and the DC voltage generation circuit receives the PWM conversion control signal and generates a voltage whose amplitude or voltage value increases as a voltage value of the pulse conversion control signal increases, and whose amplitude or voltage value decreases as a voltage value of the pulse conversion control signal decreases.

2. The image forming apparatus according to claim 1, wherein
the clock signal generation circuit is a D flip-flop, and inverts a level of the clock signal in accordance with rise or fall of the pulse signal.

3. The image forming apparatus according to claim 1, wherein
the pulse signal conversion circuit includes an integrated circuit.

4. The image forming apparatus according to claim 1, wherein
the application target is a charging member for charging a photoconductor drum, or a developing roller for developing the photoconductor drum while holding toner.

5. The image forming apparatus according to claim 1, wherein
the pulse signal conversion circuit generates the pulse conversion control signal whose voltage value increases as a duty ratio of the received pulse signal increases, and whose voltage value decreases as a duty ratio of the pulse signal decreases, or the pulse conversion control signal whose voltage value decreases as a duty ratio of the received pulse signal increases, and whose voltage value increases as a duty ratio of the pulse signal decreases.

6. The image forming apparatus according to claim 1, wherein
a first application target and a second application target, each being the application target;
a first high voltage power supply unit that is the high voltage power supply unit and applies the AC voltage and the DC voltage to the first application target and a second high voltage power supply unit that is the high voltage power supply unit and applies the AC voltage and the DC voltage to the second application target, as the high voltage power supply unit, wherein
the control circuit outputs the pulse signal and the PWM signal to each of the first high voltage power supply unit and the second high voltage power supply unit, the control circuit generating the pulse signal with a specific duty ration in accordance with whether the application target is the first application target or the second application target,
the pulse conversion control signal of the first high voltage power supply unit in input to one of the AC voltage generation circuit and the DC voltage generation circuit of the first high voltage power supply unit, or one of the AC voltage generation circuit and the DC voltage generation circuit of the second high voltage power supply unit,
the pulse conversion control signal of the second high voltage power supply unit in input to one of the AC voltage generation circuit and the DC voltage generation circuit of the second high voltage power supply unit, or one of the AC voltage generation circuit and the DC voltage generation circuit of the first high voltage power supply unit,
the PWM conversion control signal of the first high voltage power supply unit in input to the other of the AC voltage generation circuit and the DC voltage generation circuit of the first high voltage power supply unit, or the other of the AC voltage generation circuit and the DC voltage generation circuit of the second high voltage power supply unit, and
the PWM conversion control signal of the second high voltage power supply unit in input to the other of the AC voltage generation circuit and the DC voltage generation circuit of the second high voltage power supply unit, or the other of the AC voltage generation circuit and the DC voltage generation circuit of the first high voltage power supply unit.

7. The image forming apparatus according to claim 6, wherein
the first application target is a charging member for charging a photoconductor drum, and the second application target is a developing roller for developing the photoconductor drum while holding toner.

* * * * *